(12) United States Patent
Hooker

(10) Patent No.: US 12,063,718 B2
(45) Date of Patent: Aug. 13, 2024

(54) APPLIANCE WITH LEAKAGE CURRENT COMPENSATION

(71) Applicant: Midea Group Co., Ltd., Foshan (CN)

(72) Inventor: John Kenneth Hooker, Louisville, KY (US)

(73) Assignee: MIDEA GROUP CO., LTD., Foshan (CN)

( * ) Notice: Subject to any disclaimer, the term of this patent is extended or adjusted under 35 U.S.C. 154(b) by 633 days.

(21) Appl. No.: 17/362,296

(22) Filed: Jun. 29, 2021

(65) Prior Publication Data

US 2022/0418045 A1    Dec. 29, 2022

(51) Int. Cl.
*H05B 3/00*     (2006.01)
*G01R 31/52*    (2020.01)
*H05B 3/02*     (2006.01)

(52) U.S. Cl.
CPC .......... *H05B 3/0019* (2013.01); *G01R 31/52* (2020.01); *H05B 3/02* (2013.01)

(58) Field of Classification Search
CPC .... G01R 31/52; H05B 1/0263; H05B 1/0266; H05B 3/0019; H05B 3/02
USPC ....... 373/135, 109, 117, 120, 149, 140, 162; 219/240, 250, 412, 425, 448, 482, 483, 219/699, 737, 738; 330/122, 188, 276, 330/189, 105; 361/142, 149, 42, 45; 324/547, 568
See application file for complete search history.

(56) References Cited

U.S. PATENT DOCUMENTS

| | | | |
|---|---|---|---|
| 7,230,488 B2 | 6/2007 | Tsuruya | |
| 8,102,629 B2 | 1/2012 | Harris et al. | |
| 8,659,857 B2 | 2/2014 | Gandolfi | |
| 8,928,330 B2 | 1/2015 | Kim et al. | |
| 10,809,755 B1 | 10/2020 | Treichler et al. | |
| 2013/0021013 A1 | 1/2013 | Kondou | |
| 2013/0169295 A1* | 7/2013 | Cheong | G06F 3/044 324/684 |
| 2020/0375010 A1 | 11/2020 | Reh et al. | |
| 2021/0048484 A1* | 2/2021 | Pfizenmaier | G01R 31/52 |

* cited by examiner

*Primary Examiner* — Quang T Van
(74) *Attorney, Agent, or Firm* — Gray Ice Higdon

(57) ABSTRACT

A leakage current compensation system may be used in an appliance such as a cooking appliance or another device utilizing a sheathed electrical heating element, and may sense a leakage current in one or more phases of a multi-phase power circuit that supplies the appliance or other device using a current transformer and generate a compensating current in a different phase of the multi-phase power circuit to compensate for the leakage current and thereby reduce the likelihood of a false GFCI trip in the multi-phase power circuit.

22 Claims, 7 Drawing Sheets

APPLIANCE WITH LEAKAGE CURRENT COMPENSATION

BACKGROUND

Various types of appliances rely on electrical heating elements to supply heat for various types of operations. Cooking appliances such as cooktops, ranges, ovens, etc., may utilize electrical heating elements for cooktop and/or oven burners, while laundry washing machines and dishwashers may utilize electrical heating elements for heating water and laundry dryers may utilize electrical heating elements to heat air. Electrical heating elements used in many of these applications are commonly constructed as sheathed electrical heating elements, which utilize a resistive heater core that extends through a grounded sheath and generates heat when electrical current is passed through the core. Electrical insulation between the core and the sheath is generally provided by an electrically-insulative material that is housed within the sheath and that while providing electrical insulation also provides thermal conductivity to convey the heat generated by the core to the sheath.

Some sheathed electrical heating elements utilize an electrically-insulative powder such as magnesium oxide (MgO) for the electrically-insulative material; however, it has been found that MgO powder naturally absorbs moisture from the ambient environment, and this moisture can provide a path of conductivity from the heater core through the MgO powder to the grounded sheath, and as a result, can cause some portion of the electrical current supplied to the heater core to leak to ground through this path of conductivity.

In many applications, this absorption is not problematic due to the fact that whenever a sheathed electrical heating element is energized and heated up, moisture is naturally driven out of the heating element and the leakage current drops nearly to zero. However, due to more recent changes in housing codes, some appliances are increasingly being used in electrical circuits that are protected by "ground fault" (GFCI) circuit breakers, and when one of the aforementioned sheathed electrical heating elements is energized in a circuit protected by a GFCI circuit breaker while a sufficient amount of moisture has been absorbed into the heating element, the transient leakage current that is generated prior to the moisture being driven out of the heating element may be sufficient in some circumstances to trip the GFCI circuit breaker, causing a "false" GFCI trip to occur, and requiring a consumer to reset the circuit breaker before restarting the appliance. In some instances, the circuit breaker may trip and need to be reset multiple times until a sufficient amount of moisture has been driven out of the heating element, leading to frustration and potentially an unnecessary service call. This problem is particularly acute for appliances that operate using multi-phase power such as split phase power, which relies on two phases that are 180 degrees apart (e.g., 240 VAC power in the United States), and three phase power, which relies on three phases that are 120 degrees apart (e.g., 208 VAC power in the United States), as the leakage currents that are generated by the higher power heating elements used in such appliances have been found to be more likely to generate false GFCI trips.

Therefore, a need exists in the art for a manner of reducing the frequency of false GFCI trips associated with the use of sheathed electrical heating elements in an appliance supplied by multi-phase power.

SUMMARY

The herein-described embodiments address these and other problems associated with the art by providing a leakage current compensation system for an appliance such as a cooking appliance or another device utilizing a sheathed electrical heating element. The leakage current compensation system may sense a leakage current in one or more phases of a multi-phase power circuit that supplies the appliance or other device using a current transformer and generate a compensating current in a different phase of the multi-phase power circuit to compensate for the leakage current and thereby reduce the likelihood of a false GFCI trip in the multi-phase power circuit.

Therefore, consistent with one aspect of the invention, an apparatus may include first and second line inputs respectively configured to receive first and second power signals having respective first and second phases from a multi-phase power circuit, first and second line outputs respectively coupled to the first and second line inputs and configured to supply power to a sheathed electrical heating element that generates heat in response to electrical current and that includes a heater core extending through a sheath and electrically insulated from the sheath by an electrically-insulative material, a current transformer coupled intermediate the first line input and first line output and intermediate the second line input and the second line output, the current transformer configured to sense a leakage current in one of the first and second power signals, a leakage current amplifier circuit coupled to the current transformer to amplify the leakage current sensed by the current transformer, and a compensation current generator circuit coupled to the leakage current amplifier circuit and including first and second outputs respectively coupled to the first and second line inputs, the compensation current generator circuit configured to generate a first compensating current in the first output in response to the current transformer sensing the leakage current in the second power signal and to generate a second compensating current in the second output in response to the current transformer sensing the leakage current in the first power signal.

In some embodiments, the multi-phase power circuit is a split-phase power circuit. Also, in some embodiments, the multi-phase power circuit is a three-phase power circuit, and the apparatus further includes a third line input configured to receive a third power signal having a third phase from the multi-phase power circuit, and a third line output coupled to the third line input. Further, in some embodiments, the current transformer includes a first primary winding coupled between the first line input and the first line output, a second primary winding coupled between the second line input and the second line output, and a secondary winding coupled to the leakage current amplifier. Some embodiments may further include a neutral input coupled to the multi-phase power circuit and a neutral output coupled to the neutral input, and the current transformer further includes a third primary winding coupled between the neutral input and the neutral output.

In some embodiments, the current transformer includes a ring core, the first line input and first line output are coupled to one another by a first conductor that passes through the ring core, and the second line input and second line output are coupled to one another by a second conductor that passes through the ring core. In addition, in some embodiments, the leakage current amplifier circuit is configured to output an output voltage signal in response to an input voltage signal received thereby, and the apparatus further includes a current to voltage converter circuit coupled intermediate the current transformer and the leakage current amplifier, the current to voltage converter configured to generate the input voltage signal for the leakage current amplifier circuit from the leakage current sensed by the current transformer, and a voltage to current converter circuit coupled intermediate the leakage current amplifier and the compensation current generator circuit, the voltage to current converter configured to generate an input current signal to the compensation current generator based upon an output voltage signal from the leakage current amplifier circuit.

In some embodiments, the leakage amplifier circuit includes a voltage amplifier circuit configured to amplify the input voltage signal to generate an intermediate voltage signal having a DC component, an AC filter circuit configured to generate a DC offset signal representative of the DC component from the intermediate voltage signal by filtering out an AC component from the intermediate voltage signal, and a differential amplifier circuit configured to generate the output voltage signal for the leakage current amplifier circuit by removing the DC component from the intermediate voltage signal in response to the DC offset signal. In addition, in some embodiments, each of the voltage amplifier circuit, the differential amplifier circuit and the voltage to current converter circuit includes an operational amplifier, and the apparatus further includes a bi-polar power supply configured to power the operational amplifier of each of the voltage amplifier circuit, the differential amplifier circuit and the voltage to current converter circuit. Moreover, in some embodiments, the AC filter circuit includes an operational amplifier powered by the bi-polar power supply.

In some embodiments, the compensation current generator circuit includes first and second resistors respectively coupled to the first and second line inputs, and first, second, third and fourth transistors, and the first and second transistors are active mode n-type transistors and are respectively coupled to the first and second resistors and the third and fourth transistors are active mode p-type transistors and are respectively coupled to the first and second resistors.

Moreover, in some embodiments, the first, second, third and fourth transistors are MOSFETs, and the apparatus further includes first, second, third and fourth diodes, the first diode coupled intermediate the first transistor and the first resistor and configured to block reverse current through the first transistor, the second diode coupled intermediate the third transistor and the first resistor and configured to block reverse current through the third transistor, the third diode coupled intermediate the second transistor and the second resistor and configured to block reverse current through the second transistor, and the fourth diode coupled intermediate the fourth transistor and the second resistor and configured to block reverse current through the fourth transistor. In some embodiments, each of the first and second resistors is implemented using a series arrangement of multiple physical resistors.

Some embodiments may also include a monitoring circuit coupled to the first and second outputs and configured to sense the first and second compensating currents and output a monitor signal in response thereto. In addition, in some embodiments, the monitoring circuit includes first and second opto-couplers coupled respectively to the first and second outputs.

Some embodiments may also include an appliance including the sheathed electrical heating element, and the current transformer, the leakage current amplifier circuit and the compensation current generator are disposed in the appliance. Moreover, in some embodiments, the appliance is a cooking appliance and the sheathed electrical heating element is a cooktop or oven cooking element. Also, in some embodiments, the appliance includes a plurality of sheathed electrical heating elements, and the plurality of sheathed electrical heating elements are powered from the first and second line outputs. In some embodiments, the appliance includes at least one electrical load powered by only one of the first and second line outputs such that the at least one electrical load is powered by a single phase of the multi-phase power circuit. In addition, some embodiments may also include a power cord, and the current transformer, the leakage current amplifier circuit and the compensation current generator are disposed in the power cord.

Consistent with another aspect of the invention, a leakage current compensation system may include first and second line inputs respectively configured to receive first and second power signals having respective first and second phases from a multi-phase power circuit, first and second line outputs respectively coupled to the first and second line inputs and configured to supply power to a sheathed electrical heating element that generates heat in response to electrical current and that includes a heater core extending through a sheath and electrically insulated from the sheath by an electrically-insulative material, a bi-polar power supply, a current transformer coupled intermediate the first line input and first line output and intermediate the second line input and the second line output, the current transformer configured to sense a leakage current in one of the first and second power signals, a current to voltage converter circuit coupled to a secondary winding of the current transformer, the current to voltage converter configured to generate a first voltage signal by performing a current to voltage conversion of the leakage current sensed by the current transformer, a voltage amplifier circuit including a first operational amplifier powered by the bi-polar power supply and configured to amplify the first voltage signal to generate a second voltage signal having a DC component, an AC filter circuit including a second operational amplifier powered by the bi-polar power supply and configured to generate a DC offset signal representative of the DC component from the second voltage signal by filtering out an AC component from the second voltage signal, a differential amplifier circuit including a third operational amplifier powered by the bi-polar power supply and configured to generate a third voltage signal by removing the DC component from the second voltage signal in response to the DC offset signal, a voltage to current converter circuit including a fourth operational amplifier powered by the bi-polar power supply and configured to generate a compensation control signal by performing a voltage to current conversion of the third voltage signal, and a compensation current generator circuit including first and second outputs respectively coupled to the first and second line inputs, the compensation current generator circuit configured to generate at least one of a first compensating current in the first output and a second compensating current in the second output in response to the compensation control signal.

Consistent with another aspect of the invention, an apparatus may include first and second line inputs respectively configured to receive first and second power signals having respective first and second phases from a multi-phase power circuit, first and second line outputs respectively coupled to the first and second line inputs and configured to supply power to an electrical load, a current transformer coupled intermediate the first line input and first line output and intermediate the second line input and the second line output, the current transformer configured to sense a leakage current in one of the first and second power signals, a leakage current amplifier circuit coupled to the current transformer to amplify the leakage current sensed by the current transformer, and a compensation current generator circuit coupled to the leakage current amplifier circuit and including first and second outputs respectively coupled to the first and second line inputs, the compensation current generator circuit configured to generate a first compensating current in the first output in response to the current transformer sensing the leakage current in the second power signal and to generate a second compensating current in the second output in response to the current transformer sensing the leakage current in the first power signal.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described example embodiments of the invention. This summary is merely provided to introduce a selection of concepts that are further described below in the detailed description, and is not intended to identify key or essential features of the claimed subject matter, nor is it intended to be used as an aid in limiting the scope of the claimed subject matter.

DETAILED DESCRIPTION

Figure 1:
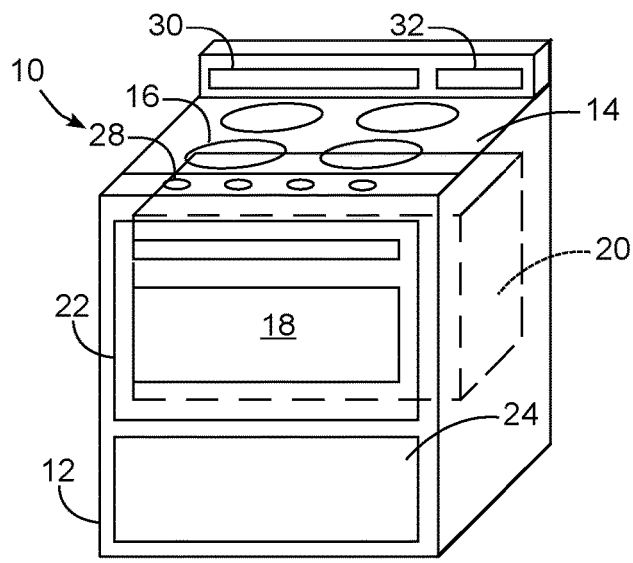
FIG. 1 is a perspective view of a cooking appliance consistent with some embodiments of the invention.

Turning now to the drawings, wherein like numbers denote like parts throughout the several views, FIG. 1 illustrates an example appliance 10 in which the various technologies and techniques described herein may be implemented. Appliance 10 in the illustrated embodiment is a cooking appliance, and in particular, a residential-type range, and as such includes a housing 12, a stovetop or cooktop 14 including a plurality of burners 16, and an oven 18 defining an oven or cooking cavity 20 accessed via an oven door 22. Cooking appliance 10 may also include a storage drawer 24 in some embodiments, or in other embodiments, may include a second oven. Various cooking elements (not shown in FIG. 1) may also be incorporated into cooking appliance 10 for cooking food in oven 18, e.g., one or more electric or gas cooking elements.

Cooking appliance 10 may also include various user interface devices, including, for example, control knobs 28 for controlling burners 16, a control panel 30 for controlling oven 18 and/or burners 16, and a display 32 for providing visual feedback as to the activation state of the cooking appliance. It will be appreciated that cooking appliance 10 may include various types of user controls in other embodiments, including various combinations of switches, buttons, knobs and/or sliders, typically disposed at the rear or front (or both) of the cooking appliance. Further, in some embodiments, one or more touch screens may be employed for interaction with a user. As such, in some embodiments, display 32 may be touch sensitive to receive user input in addition to displaying status information and/or otherwise interacting with a user. In still other embodiments, cooking appliance 10 may be controllable remotely, e.g., via a smartphone, tablet, personal digital assistant or other networked computing device, e.g., using a web interface or a dedicated app.

Display 32 may also vary in different embodiments, and may include individual indicators, segmented alphanumeric displays, and/or dot matrix displays, and may be based on various types of display technologies, including LEDs, vacuum fluorescent displays, incandescent lights, etc. Further, in some embodiments audio feedback may be provided to a user via one or more speakers, and in some embodiments, user input may be received via a spoken or gesture-based interface.

As noted above, cooking appliance 10 of FIG. 1 is a range, which combines both a stovetop and one or more ovens, and which in some embodiments may be a standalone or drop-in type of range. In other embodiments, however, cooking appliance 10 may be another type of cooking appliance, e.g., a wall mount or freestanding oven, or a stovetop or cooktop. In general, a cooking appliance consistent with the invention may be considered to include any residential-type appliance including a housing and one or more electrical cooking elements disposed therein and configured to generate energy for cooking food.

In turn, a cooking element may be considered to include practically any type of energy-producing element used in residential applications in connection with cooking food, e.g., employing various cooking technologies such as electric, gas, light, microwaves, induction, convection, radiation, etc. In the case of an oven, for example, one or more cooking elements therein may be gas, electric, light, or microwave cooking elements in some embodiments, while in the case of a stovetop, one or more cooking elements therein may be gas, electric, or inductive cooking elements in some embodiments. Further, it will be appreciated that any number of cooking elements may be provided in a cooking appliance (including multiple cooking elements for performing different types of cooking cycles such as baking or broiling, including multiple bake and/or multiple broiler cooking elements, as well as one or more convection cooking elements), and that multiple types of cooking elements may be combined in some embodiments, e.g., combinations of microwave and light cooking elements in some oven embodiments.

As will become more apparent below, in the illustrated embodiment, at least one cooking element is implemented using a sheathed electrical heating element, and it will be appreciated that in some embodiments, all cooking elements may be sheathed electrical heating elements, while in other embodiments, different cooking technologies may be combined, e.g., an oven with sheathed electrical heating elements combined with a cooktop using gas burners or inductive cooking elements (among others).

Moreover, it will be appreciated that various other types of appliances may utilize sheathed electrical heating elements in addition to or in lieu of sheathed electrical heating elements utilized for cooking purposes, e.g., laundry dryers, which utilize heating elements for heating air used to dry clothing, dishwashers or laundry washing machines, which utilize heating elements for heating water and/or wash fluids used in washing, etc. Thus, while the embodiments discussed hereinafter focus on a particular application of a leakage current compensation system in a cooking appliance incorporating one or more sheathed electrical heating elements as cooking elements, it will be appreciated that the principles of the invention may apply to other applications, including other appliances as well as other non-appliance applications in which sheathed electrical heating elements are used, and the invention is therefore not limited to the use of a leakage current compensation system in a cooking appliance. Moreover, it will also be appreciated that the principles of the invention may apply to other applications, including other appliances as well as other non-appliance applications in which electrical loads other than sheathed electrical heating elements are used and are capable of generating leakage currents that could potentially cause false GFCI trips (e.g., as in the case of outdoor HVAC equipment), and the invention is therefore also not limited to the use of a leakage current compensation system in connection with sheathed electrical heating elements.

Figure 2:
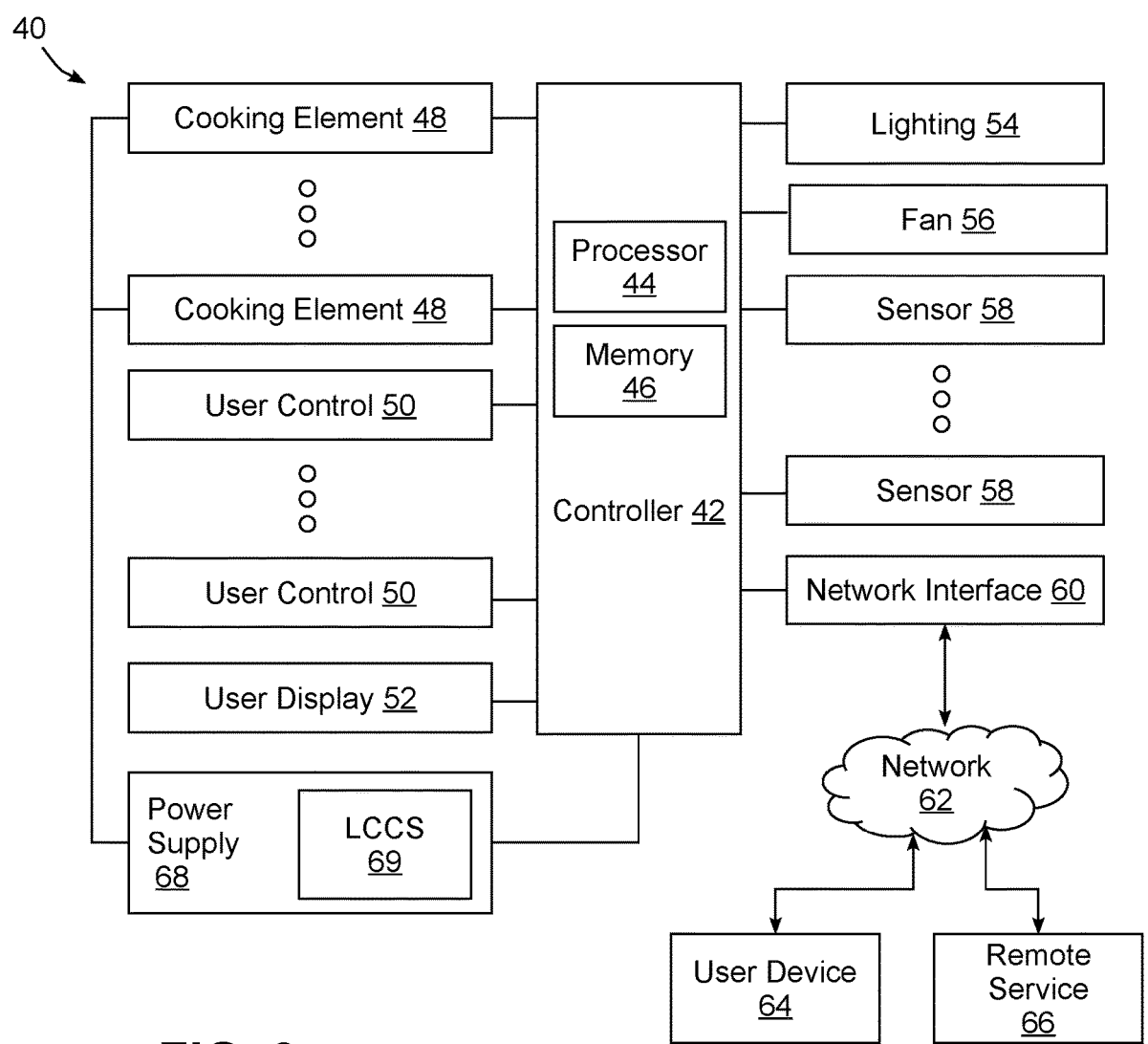
FIG. 2 is a block diagram of an example control system for a cooking appliance consistent with some embodiments of the invention.

A cooking appliance consistent with the invention also generally includes one or more controllers configured to control the cooking elements and otherwise perform cooking operations at the direction of a user, e.g., cooktop cooking operations when using cooktop cooking elements and oven cooking operations when using oven cooking elements, each of which involving the activation of one or more cooking elements to generate heat used in cooking. FIG. 2, for example, illustrates an example embodiment of a cooking appliance 40 including a controller 42 that receives inputs from a number of components and drives a number of components in response thereto. Controller 42 may, for example, include one or more processors 44 and a memory 46 within which may be stored program code for execution by the one or more processors. The memory may be embedded in controller 42, but may also be considered to include volatile and/or non-volatile memories, cache memories, flash memories, programmable read-only memories, read-only memories, etc., as well as memory storage physically located elsewhere from controller 42, e.g., in a mass storage device or on a remote computer interfaced with controller 42.

As shown in FIG. 2, controller 42 may be interfaced with various components, including various cooking elements 48 used for cooking food (e.g., various combinations of gas, electric, inductive, light, microwave, light cooking elements, among others), one or more user controls 50 for receiving user input (e.g., various combinations of switches, knobs, buttons, sliders, touchscreens or touch-sensitive displays, microphones or audio input devices, image capture devices, etc.), and a user display 52 (including various indicators, graphical displays, textual displays, speakers, etc.), as well as various additional components suitable for use in a cooking appliance, e.g., lighting 54 and/or one or more fans 56 (e.g., convection fans, cooling fans, etc.), among others.

Controller 42 may also be interfaced with various sensors 58 located to sense environmental conditions inside of and/or external to cooking appliance 40, e.g., one or more temperature sensors, humidity sensors, air quality sensors, smoke sensors, carbon monoxide sensors, odor sensors and/or electronic nose sensors, among others. Such sensors may be internal or external to cooking appliance 40, and may be coupled wirelessly to controller 42 in some embodiments.

In some embodiments, controller 42 may also be coupled to one or more network interfaces 60, e.g., for interfacing with external devices via wired and/or wireless networks such as Ethernet, Wi-Fi, Bluetooth, NFC, cellular and other suitable networks, collectively represented in FIG. 2 at 62. Network 62 may incorporate in some embodiments a home automation network, and various communication protocols may be supported, including various types of home automation communication protocols. In other embodiments, other wireless protocols, e.g., Wi-Fi or Bluetooth, may be used. In some embodiments, cooking appliance 40 may be interfaced with one or more user devices 64 over network 62, e.g., computers, tablets, smart phones, wearable devices, etc., and through which cooking appliance 40 may be controlled and/or cooking appliance 40 may provide user feedback. Further, in some embodiments, cooking appliance 40 may be interfaced with one or more remote services 66, e.g., cloud-based services, remote servers.

In some embodiments, controller 42 may operate under the control of an operating system and may execute or otherwise rely upon various computer software applications, components, programs, objects, modules, data structures, etc. In addition, controller 42 may also incorporate hardware logic to implement some or all of the functionality disclosed herein. Further, in some embodiments, the sequences of operations performed by controller 42 to implement the embodiments disclosed herein may be implemented using program code including one or more instructions that are resident at various times in various memory and storage devices, and that, when read and executed by one or more hardware-based processors, perform the operations embodying desired functionality. Moreover, in some embodiments, such program code may be distributed as a program product in a variety of forms, and that the invention applies equally regardless of the particular type of computer readable media used to actually carry out the distribution, including, for example, non-transitory computer readable storage media. In addition, it will be appreciated that the various operations described herein may be combined, split, reordered, reversed, varied, omitted, parallelized and/or supplemented with other techniques known in the art, and therefore, the invention is not limited to the particular sequences of operations described herein.

Numerous variations and modifications to the cooking appliances illustrated in FIGS. 1-2 will be apparent to one of ordinary skill in the art, as will become apparent from the description below. Therefore, the invention is not limited to the specific implementations discussed herein.

Leakage Current Compensation System

As discussed above, a sheathed electrical heating element, which utilizes a resistive heater core that extends through a grounded sheath and is insulated therefrom by an electrically-insulative material, may be prone to absorbing moisture from the ambient environment. The amount of moisture that is absorbed may vary based upon the temperature and/or humidity of the ambient environment, as well as the amount of time since the heating element was used, since normal use of the heating element to generate heat generally drives moisture out of the heating element. This absorption may be especially prominent for brand new heating elements and appliances or products including such heating elements, which may be subject to widely varying environments during shipping and storage, as well as for heating elements that have not been used for some period of time, e.g., in the case of vacation homes or seasonal rentals.

Figure 3:
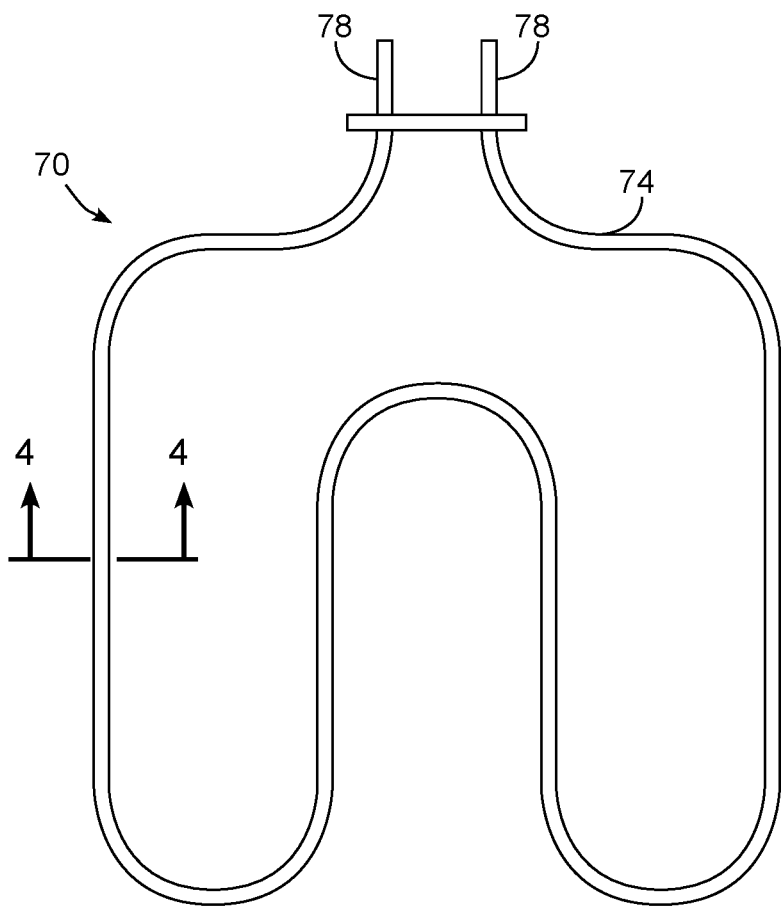
FIG. 3 is a top plan view of an example sheathed electrical heating element used as an oven cooking element in the cooking appliance of FIG. 1 or the cooking appliance of FIG. 2.
Figure 4:
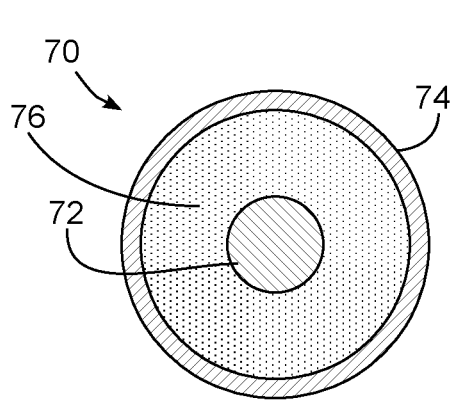
FIG. 4 is a cross-sectional view taken through lines 4-4 of FIG. 3.

FIGS. 3-4, for example, illustrate an example sheathed electrical heating element 70 suitable for use in some embodiments as the bake or broil cooking element for an oven, including a heater core 72 that is housed within a sheath 74 and that is electrically insulated therefrom by an electrically-insulative material 76 that also provides thermal conductivity to convey the heat generated by core 72 to sheath 74. Core 72 may be formed of a resistive material such as NiCr and may be formed, for example, from one or more helix coils in some embodiments. Sheath 74 may be formed of an electrically conductive material such as a stainless steel alloy, and is generally grounded. A voltage supplied across a pair of connectors 78 may generate current through core 72 to generate heat.

The electrically-insulative material 76 in some embodiments may be an electrically-insulative powder such as magnesium oxide (MgO), although other materials that provide both electrical insulation and thermal conductivity may be used. MgO powder, in particular, is hygroscopic and naturally absorbs moisture from the ambient environment, and this moisture can provide a path of conductivity from core 72 through the MgO powder to the grounded sheath 74, and as a result, can cause some portion of the electrical current supplied to the heater core to leak to ground through this path of conductivity.

Figure 5:
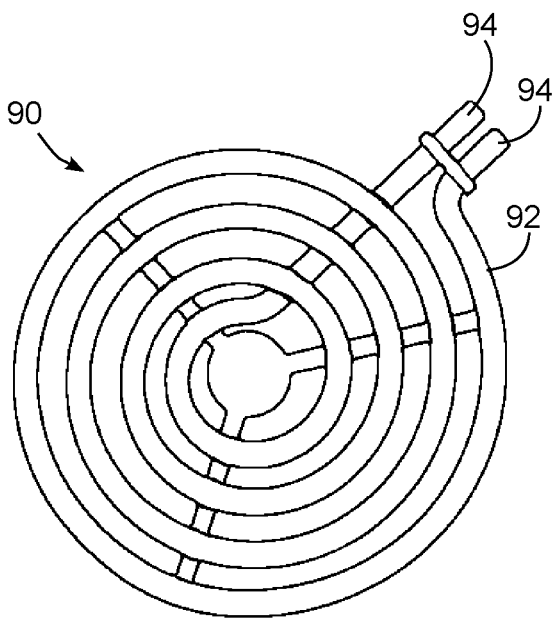
FIG. 5 is a top plan view of an example sheathed electrical heating element used as a cooktop cooking element in the cooking appliance of FIG. 1 or the cooking appliance of FIG. 2.

FIG. 5 illustrates an example electrical heating element 90 suitable for use as a cooktop cooking element, including a coiled sheath 92 that terminates in a pair of connectors 94. Similar to oven electrical cooking element 70 of FIGS. 3-4, cooktop electrical cooking element 90 includes a core and electrically-insulative material, e.g., in a similar arrangement to that illustrated in FIG. 4, and as such a cross-section of FIG. 5 is not included herein.

It will be appreciated that different materials, geometries, shapes, sizes, core configurations, etc. of sheathed electrical heating elements may be used in other embodiments. As such, the invention is not limited to the specific embodiments illustrated in FIGS. 3-5, as will be appreciated by those of ordinary skill in the art having the benefit of the instant disclosure. Specifically, while sheathed electrical heating elements 70, 90 are illustrated as configured for use as cooking elements, it will be appreciated that similar designs, or designs having similar constructions but having differing sizes and/or shapes, may also be used in non-cooking applications, e.g., to heat water or liquid (e.g., in a hot water heater, a dishwasher, a laundry washing machine, etc.), to heat air (e.g., in a laundry dryer or HVAC system), or for other heating applications capable of utilizing heat generated by a sheathed electrical heating element.

As also discussed above, due to more recent changes in housing codes, some sheathed electrical heating elements are increasingly being used in electrical circuits that are protected by GFCI circuit breakers, and when one of the aforementioned sheathed electrical heating elements is energized in a circuit protected by a GFCI circuit breaker while a sufficient amount of moisture has been absorbed into the heating element, the transient leakage current that is generated prior to the moisture being driven out of the heating element may be sufficient in some circumstances to trip the GFCI circuit breaker, causing a "false" GFCI trip to occur, and requiring a consumer to reset the circuit breaker before restarting the appliance. Further, the problem is particularly acute for appliances that operate using multi-phase power such as split phase power, which relies on two phases that are 180 degrees apart (e.g., 240 VAC power in the United States), and three phase power, which relies on three phases that are 120 degrees apart (e.g., 208 VAC power in the United States), as the leakage currents that are generated by the higher power heating elements used in such appliances have been found to be more likely to generate false GFCI trips.

Embodiments consistent with the invention, however, may utilize a leakage current compensation system to compensate for any leakage current generated in one phase of a multi-phase power circuit as a result of a sheathed electrical heating element by generating a compensating current in another phase of the multi-phase power circuit. By doing so, the likelihood of a GFCI trip occurring is generally reduced.

FIG. 2, for example, illustrates a power supply 68 in appliance 40 that includes a leakage current compensation system (LCCS) 69 consistent with some embodiments of the invention. Power supply 68, for example, may be configured to receive power from a multi-phase power circuit such as a residential or commercial electrical service split-phase or three-phase power circuit, e.g., a 240V split-phase power circuit or a 208V three-phase power circuit.

It will be appreciated that LCCS 69 may be implemented in some embodiments within an appliance such as appliance 40, and thus may be used in connection with electrical loads such as sheathed electrical cooking elements used in such an appliance. LCCS 69 may also be used in connection with other loads in appliance 40, e.g., loads supplied by 120V single-phase power (including, for example, the electrical loads other that the cooking elements 48 illustrated in FIG. 2), while in other embodiments, LCCS 69 may only be used with electrical loads subject to potential false GFCI trips, e.g., due to moisture absorption by a sheathed electrical heating element, with other electrical loads supplied with power separately.

Further, in some embodiments, LCCS 69 may be implemented within circuitry disposed in a housing of appliance 40, e.g., as a component of an internal power supply of the appliance. In other embodiments, however, LCCS 69 may be implemented externally from the main housing of the appliance, e.g., in a power cord, in a separate enclosure, etc. LCCS 69 further may have other applications beyond the specific applications discussed herein, and accordingly, the invention is not limited to these specific applications.

In some embodiments, a leakage current compensation system consistent with the invention may incorporate a current transformer that senses a leakage current in one of two or more power signals supplied from two or more line inputs coupled to a multi-phase power circuit. The sensed leakage current is then amplified by a leakage current amplifier circuit and used by a compensation current generator circuit that is coupled to the line inputs to supply a compensation current to a different line input and thereby reduce the leakage current sensed by any GFCI device coupled to the multi-phase power circuit. Moreover, as will become more apparent below, in embodiments consistent with the invention, moreover, the leakage current compensation system is implemented as an open loop system in which a sensed leakage current is used to drive a compensating current back through the line inputs of a multi-phase power circuit without feeding the compensation current back into the leakage current compensation system.

Figure 6:
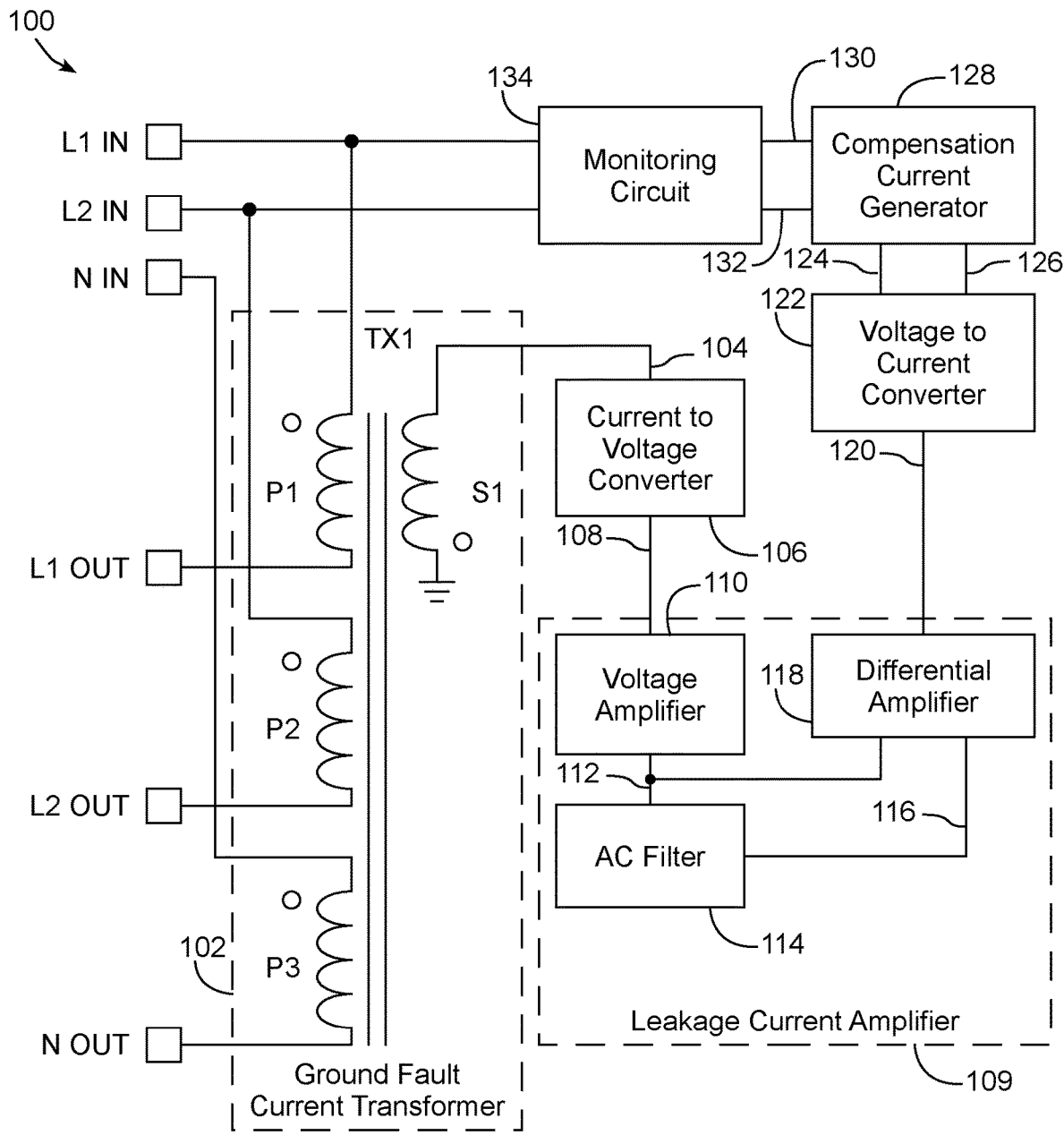
FIG. 6 is a circuit diagram illustrating an example implementation of a leakage current compensation system capable of being implemented in the cooking appliance of FIG. 1 or the cooking appliance of FIG. 2.

FIG. 6 illustrates an example implementation of an apparatus 100 including a leakage current compensation system consistent with some embodiments of the invention, e.g., an appliance, a cooking appliance, a power cord, a stand-alone power supply, etc. For the purposes of this example, a 240V split-phase power circuit is assumed, with first and second line inputs (L1 IN and L2 IN) and a neutral input (N IN) receiving power from the 240V split-phase power circuit, with the first line input receiving a first power signal from a first phase of the power circuit and the second line input receiving a second power signal from a second phase of the power circuit. Each of the L1 IN, L2 IN and N IN inputs is coupled to a corresponding output (L1 OUT, L2 OUT and N OUT) through a ground fault current transformer 102, and specifically through a respective primary winding (P1, P2, P3) of current transformer 102. Primary windings P1, P2 and P3 have the same polarity, and a secondary winding S1 has an opposite polarity to the primary windings.

In the illustrated embodiment, current transformer 102 includes a ring core, with secondary winding S1 wound about the ring core, and with the primary windings P1, P2, P3 formed by passing conductors that electrically couple the L1 IN, L2 IN and N IN inputs to the L1 OUT, L2 OUT and N OUT outputs through the ring core, such that each primary winding effectively has a single turn. It will be appreciated that in other embodiments, the neutral N input may not be passed through current transformer 102, and in still other embodiments, e.g., utilizing a three-phase power circuit, an additional line input may be passed through current transformer 102 and coupled to an additional line output.

Current transformer 104 as illustrated is configured as a zero sequence or core balance current transformer (CBCT) that effectively senses a net leakage current based upon a difference in the current supplied by the L1 IN and L2 IN inputs and the current consumed by the electrical L1 OUT and L2 OUT outputs. While various turn ratios may be used in different embodiments, a turn ratio of 1000 or 2000 (based upon 1000 or 2000 turns in the secondary winding vs. the one turn in each primary winding) may be used in some embodiments.

Secondary winding S1 of current transformer outputs a leakage current signal 104 that is supplied to a current to voltage converter circuit 106 to generate an input voltage signal 108 for a leakage current amplifier circuit 109 that is used to amplify the input voltage signal. In the illustrated embodiment, leakage current amplifier circuit 109 is used to amplify an AC voltage signal and output an amplified AC voltage signal; however, as will be discussed in greater detail below, the amplification of the AC voltage signal may generate a DC offset in some instances, so additional circuitry to remove the DC offset may be used. Thus, in some embodiments, leakage current amplifier 109 may include a voltage amplifier 110 that amplifies input voltage signal 108 to generate an intermediate voltage signal 112 that includes a DC component as a result of amplification. The intermediate voltage signal 112 may be provided to an AC filter circuit 114 that filters the AC component from the intermediate voltage signal 112 to generate a DC offset signal 116, as well as to a differential amplifier 118 that additionally receives the DC offset signal 116 from AC filter circuit 114 to remove the DC component from the intermediate voltage signal 112 and thereby generate an output voltage signal 120 that is a voltage-amplified representation of input voltage signal 110.

Output voltage signal 120 is then provided to a voltage to current converter circuit 122 that converts the output voltage signal 120 to an input current signal over a pair of inputs 124, 126 to a compensation current generator circuit 128. As will be discussed in greater detail below, compensation current generator circuit 128 receives the input current signal and includes a pair of outputs 130, 132 that are respectively coupled to the first and second line inputs L1 IN and L2 IN to output a compensation current to one of the line inputs to compensate for leakage current sensed by current transformer 102, specifically by generating a compensating current in the line input corresponding to one of the phases of the split-phase power circuit to counteract a leakage current sensed in the other of the phases of the split-phase power circuit.

Figure 7:
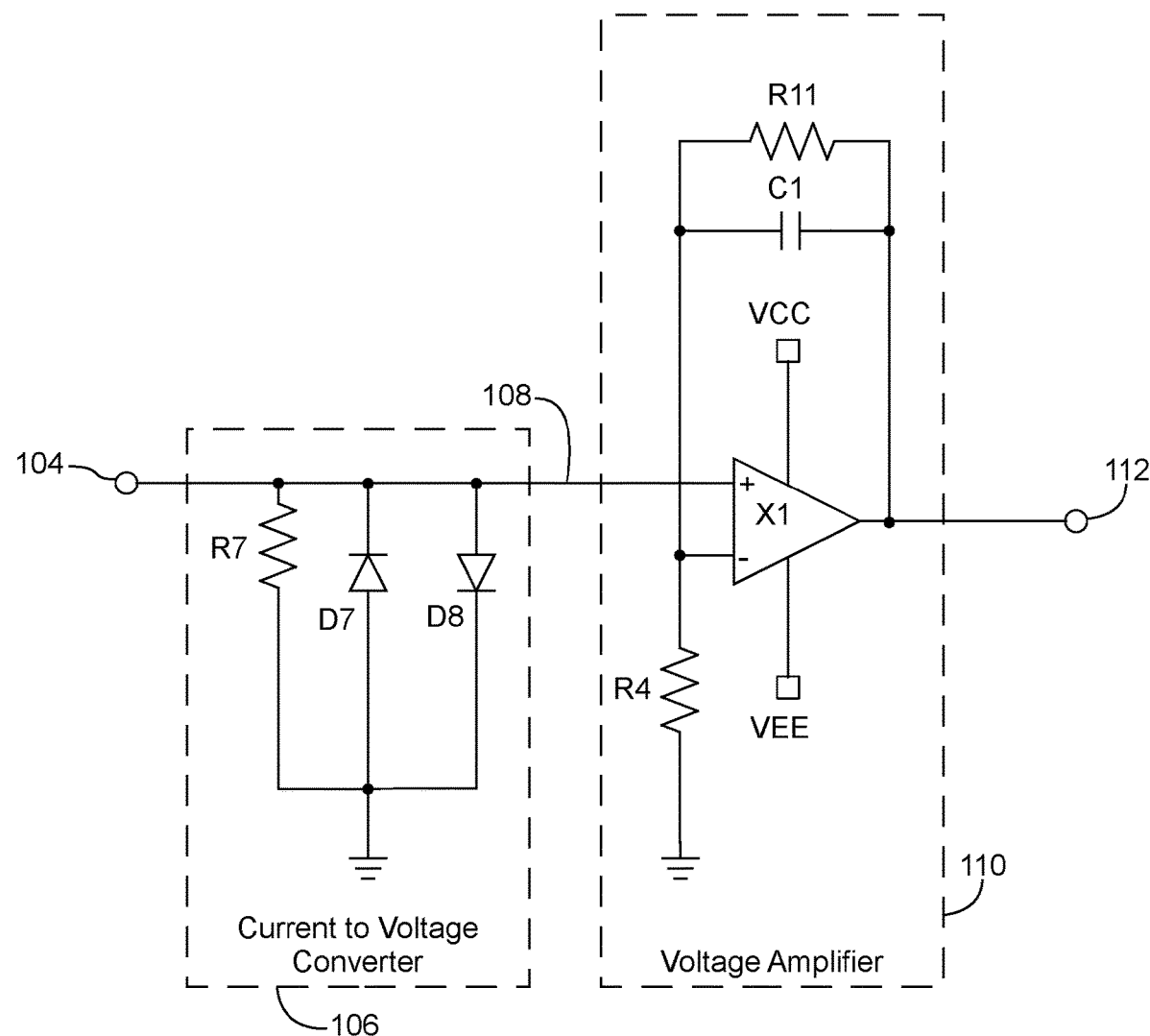
FIG. 7 is a circuit diagram of an example implementation of the current to voltage circuit and the leakage current amplifier circuit referenced in FIG. 6.

FIGS. 7-10 next illustrate example implementations of the various circuits 106, 110, 114, 118, 122, 128 and 134 illustrated in FIG. 6. FIG. 7, for example, illustrates the current to voltage converter circuit 106 and voltage amplifier circuit 110 in greater detail. Current to voltage converter circuit 106, for example, includes a burden resistor R7 coupled between secondary winding S1 and ground, with a pair of back-to-back signal diodes D7 and D8 coupled in parallel therewith. Burden resistor R7 may be a relatively small value (e.g., about 200 Ohms) to minimize phase shift, and diodes D7 and D8 (e.g., 1N4148 diodes) may be used to protect the positive input of an op-amp X1 in voltage amplifier circuit 110 from large ground fault current.

Op-amp X1 desirably has a sufficient gain bandwidth product and slew-rate with a low input offset voltage, e.g., an On Semiconductor MC33274A quad op-amp with a gain bandwidth product of 24 MHz, a slew-rate of 10 V/us, and an offset voltage of 100 uV. Op-amp X1 is configured as a non-inverting amplifier with its negative input coupled to ground through a resistor R4 and coupled to the output through a parallel arrangement of a resistor R11 and capacitor C1. In the illustrated embodiment, R11 and R4 may be selected to provide a gain of about 100 (e.g., 100k and 1k Ohms, respectively), and with C1 selected to provide minimal high frequency roll-off (e.g., 47 pF). With such a configuration, a 5 mA leakage current sensed by the current transformer will produce a signal of about (5 mA/2000 T)*200 Ohms*100=about 50 mV.

Figure 8:
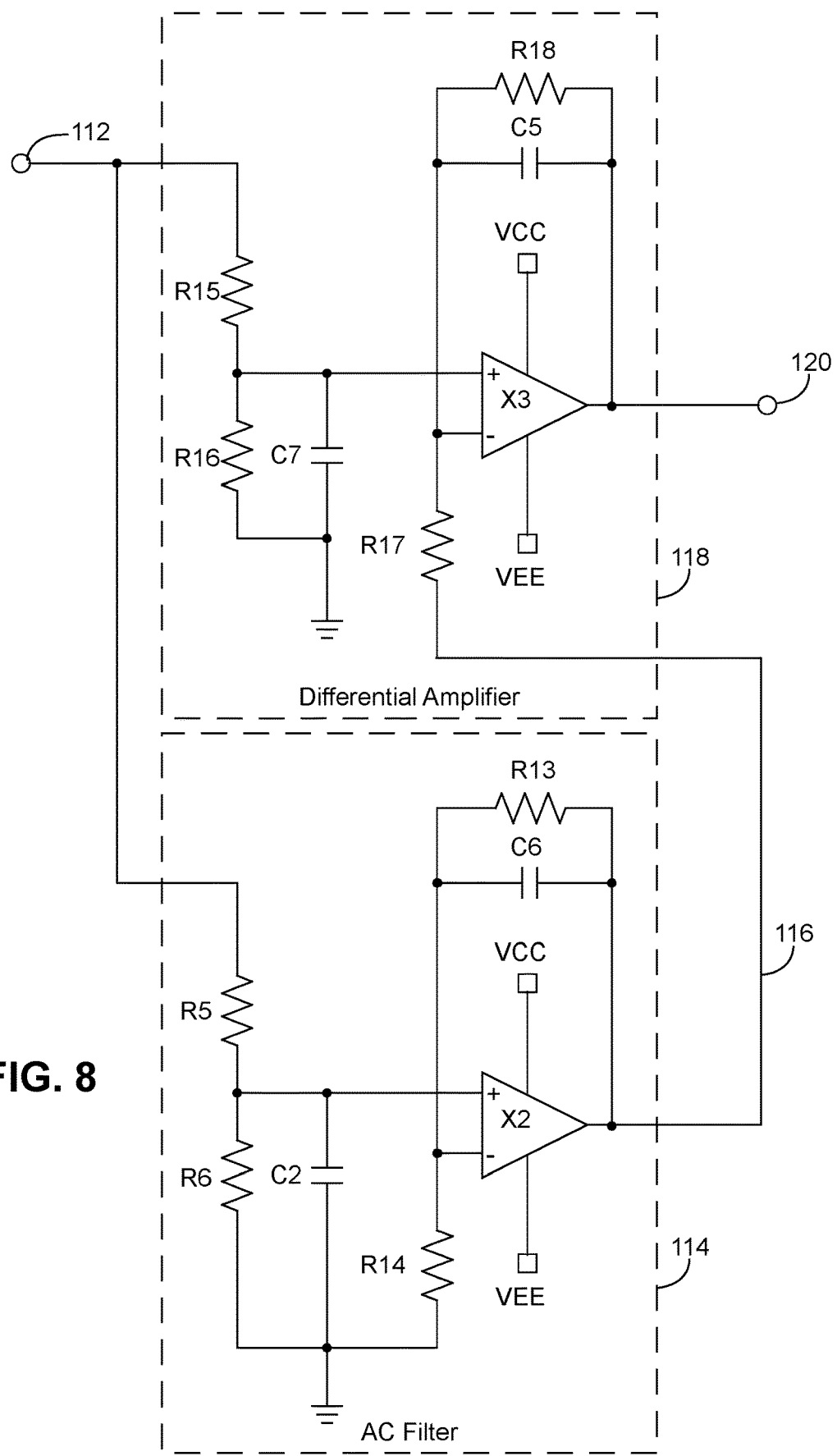
FIG. 8 is a circuit diagram of an example implementation of the differential amplifier circuit and AC filter circuit referenced in FIG. 6.

With the typical offset voltage of the MC33274A of 100 uV and a gain of 100, the typical DC offset at the output of op-amp X1 will therefore be in the range of 10 mV, or about 20% of the signal level, so it may be desirable in some embodiments to remove this DC offset, which is performed by AC filter circuit 114 and differential amplifier circuit 118 of FIG. 8.

Specifically, AC filter circuit 114 may include a second op-amp X2 coupled in a non-inverting configuration, with the positive input coupled between resistors R5 and R6, the former of which is coupled to receive the intermediate voltage signal 122 output by op-amp X1, and the latter of which is coupled to ground. A capacitor C2 is coupled in parallel with resistor R6, and resistors R5 and R6 along with capacitor C2 form a low-pass filter to suppress the AC component (60 Hz in the United States) of the intermediate voltage signal. In some embodiments, R5 and R6 may be 100k Ohm resistors and C2 may be a 2.2 uF capacitor.

The negative input of op-amp X2 may be coupled to ground through a resistor R14 and coupled to the output of op-amp X2 through a parallel arrangement of a resistor R13 and capacitor C6. The overall DC gain of op-amp X2 may be set to unity, e.g., by using 100k Ohm resistors for R13 and R14, and capacitor C6 may be included to add a small amount of additional high frequency attenuation (e.g., with a value of 10 nF), although most high frequency components are removed by the low-pass filter formed by capacitor C2 and resistors R5 and R6.

Differential amplifier circuit 118 includes a third op-amp X3, which is also configured in a non-inverting configuration, and which receives at its positive input the intermediate voltage signal 112 passed through a low-pass filter formed by resistors R15 and R16 and capacitor C7. Resistors R15 and R16 and capacitor C7 may be set to filter frequencies above the base 60 Hz signal, and thus may be configured with values such as 10k Ohms for resistors R15 and R16 and 1 nF for capacitor C7.

The negative input of op-amp X3 may be coupled to the DC offset signal 116 output by op-amp X2 through a resistor R17 and coupled to the output of op-amp X3 through a parallel arrangement of a resistor R18 and capacitor C5, and the overall gain of op-amp X3 may be set to unity, e.g., by using 10k Ohm resistors for R17 and R18, and capacitor C5 may also be included to add a small amount of additional high frequency attenuation (e.g., with a value of 1 nF). In this configuration, the DC component of the intermediate voltage signal 112 is effectively filtered out, such that the output voltage signal 120 is an AC signal representative of the leakage current sensed by the current transformer with little or no DC offset.

Figure 9:
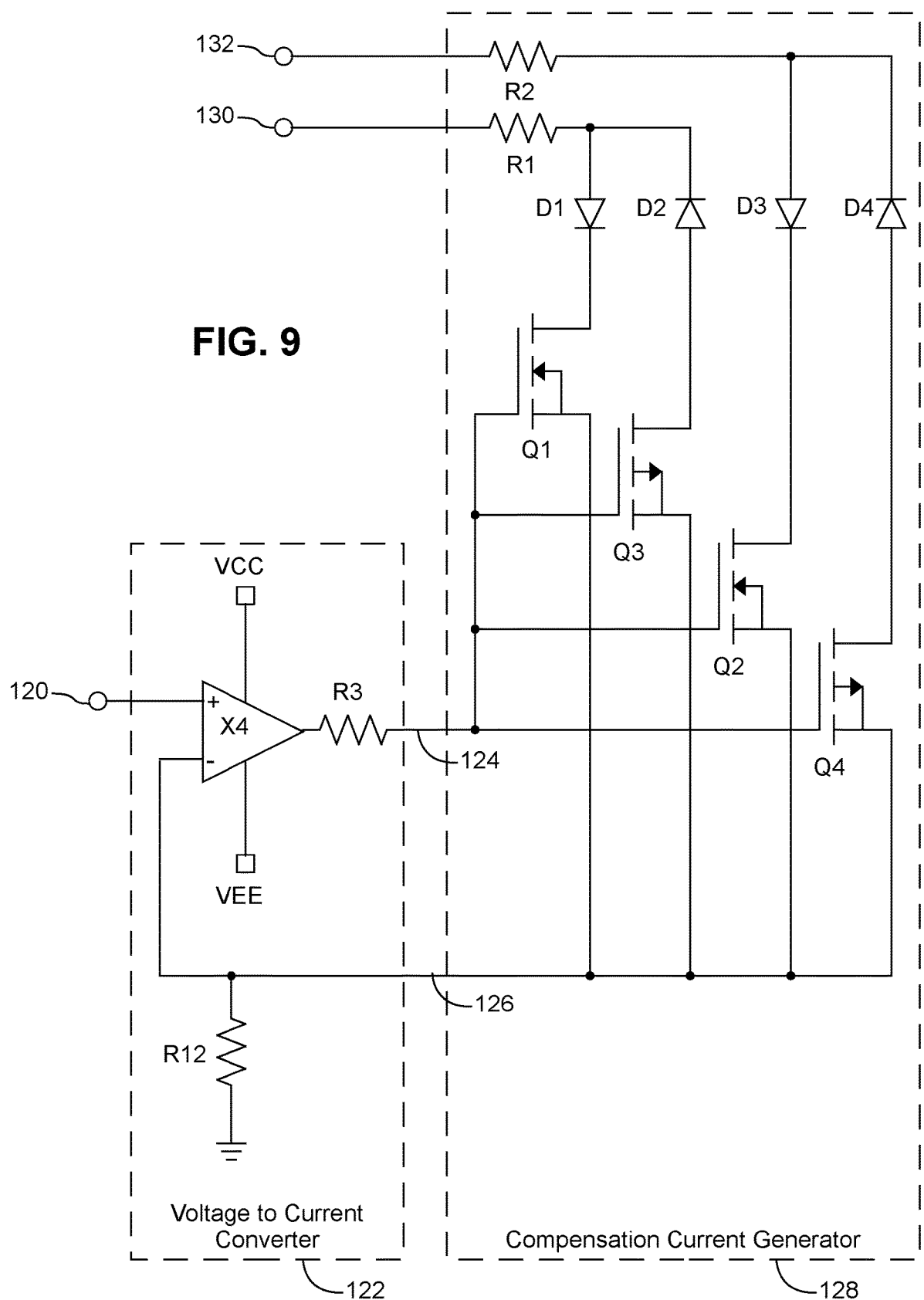
FIG. 9 is a circuit diagram of an example implementation of the voltage to current converter circuit and compensation current generator circuit referenced in FIG. 6.

Next, turning to FIG. 9, voltage to current converter circuit 122 may include a fourth op-amp X4 that converts the output voltage signal 120 (e.g., about 50 mV for a 5 mA leakage current) received at its positive input to a desired compensating current (e.g., in the example given 5 mA) across a pair of lines 124, 126 by feeding back the voltage developed across a shunt resistor R12 coupling the negative input to ground, which in some embodiments may be 10 Ohms. Lines 124, 126 thereby provide an input current signal to compensation current generator circuit 128. A resistor R3, e.g., having a value of 50 Ohms, may also be coupled between the output of op-amp X4 and line 124.

In the illustrated embodiment, each of op-amps X1, X2, X3 and X4 may be On Semiconductor MC33274A op-amps disposed on the same semiconductor device, although the invention is not so limited. Further, while the illustrated embodiment includes essentially four stages of op-amps, it will be appreciated by those of ordinary skill in the art having the benefit of the instant disclosure that different circuits, including different numbers and/or types of stages, may be used in other embodiments. For example, where an op-amp that is used to amplify the sensed leakage current does not generate a significant DC offset, filtering of a DC component from the amplified leakage current may not be necessary in some embodiments.

Compensation current generator circuit 128 receives as input the input current signal across lines 124, 126, and includes a network of four transistors Q1, Q2, Q3 and Q4, e.g., MOSFETs as illustrated in FIG. 9, or alternatively, bi-polar junction transistors in other embodiments. Each of transistors Q1-Q4 operates in active mode, and transistors Q1 and Q2 are n-type transistors while transistors Q3 and Q4 are p-type transistors. The gate of each transistor Q1-Q4 is coupled to line 124, and the source of each transistor Q1-Q4 is coupled to line 126. The drains of transistors Q1 and Q3 are coupled to a resistor R1 respectively through diodes D1 and D2, while the drains of transistors Q2 and Q4 are coupled to a resistor R2 respectively through diodes D3 and D4. Resistor R1 is coupled to output 130, which in turn is coupled to the L1 IN line input, while resistor R2 is coupled to output 132, which is in turn coupled to the L2 IN line input.

When no leakage is present, op-amp X4 can hover anywhere in the +/− range below the gate threshold voltage of transistors Q1-Q4, e.g., in the 3V to 4V range. However, when leakage is present, and depending on the direction, the op-amp X4 output will rise to a level sufficient to start transistor conduction, with a positive output by op-amp X4 generating a compensating current for L1 IN and a negative output by op-amp X4 generating a compensating current for L2 IN. Transistors Q1 and Q2 are n-channel and thus create positive ground leakage current for L1 IN and L2 IN, respectively, while transistors Q3 and Q4 are p-channel and thus create negative ground leakage current for L1 IN and L2 IN, respectively. It will be appreciated that, in the case where the net leakage current is simply resistive and completely in-phase with either L1 or L2, then the compensation current will generally only be taken from the opposite phase. Positive leakage current from L1 (current into the P1 dot) will generally cause current out of the S1 dot, which produces a negative voltage into and out of the op-amps (since all op-amps are non-inverting), thus causing transistor Q4 to conduct negative, and therefore cancel, current from L2 (since L2 will be negative when L1 is positive in the case of a 240V power circuit). Similarly, negative leakage current from L1 (current out of the P1 dot) will generally cause current into the S1 dot, which produces a positive voltage into and out of the op-amps, thus causing transistor Q3 to conduct positive, and therefore cancel, current from L2 (since L2 will be positive when L1 is negative). Transistors Q1 and Q2 perform similar roles when net leakage current is from L2 instead of L1. It will also be appreciated, however, that leakage current may also be caused at least in part by capacitive leakage, and in such cases all four transistors may be operating concurrently in a 60 Hz line cycle to achieve desired cancelation.

Diodes D1-D4 are placed in series with transistors Q1-Q4 to block reverse current flowing through the transistor intrinsic body diodes, at least when transistors Q1-Q4 are implemented using MOSFET transistors. When bi-polar junction transistors are used, diodes D1-D4 may be omitted. The diodes should have a sufficient voltage rating but only low current capacity since the illustrated embodiment is configured to compensate for up to 20 mA.

Resistors R1 and R2 set the maximum amount of leakage current that can be compensated. In this embodiment, 6K Ohm resistors are used, setting the maximum compensation at 20 mA. In some embodiments, the resistance can be broken up into multiple physical resistors to distribute power dissipation, as well as to avoid a failure mode of a single resistor failing (e.g., when using a series arrangement of multiple physical resistors. In the illustrated embodiment, for example, resistors R1 and R2 will dissipate 2.4 W each under nominal voltage conditions if compensating the full 20 mA in both directions.

Figure 10:
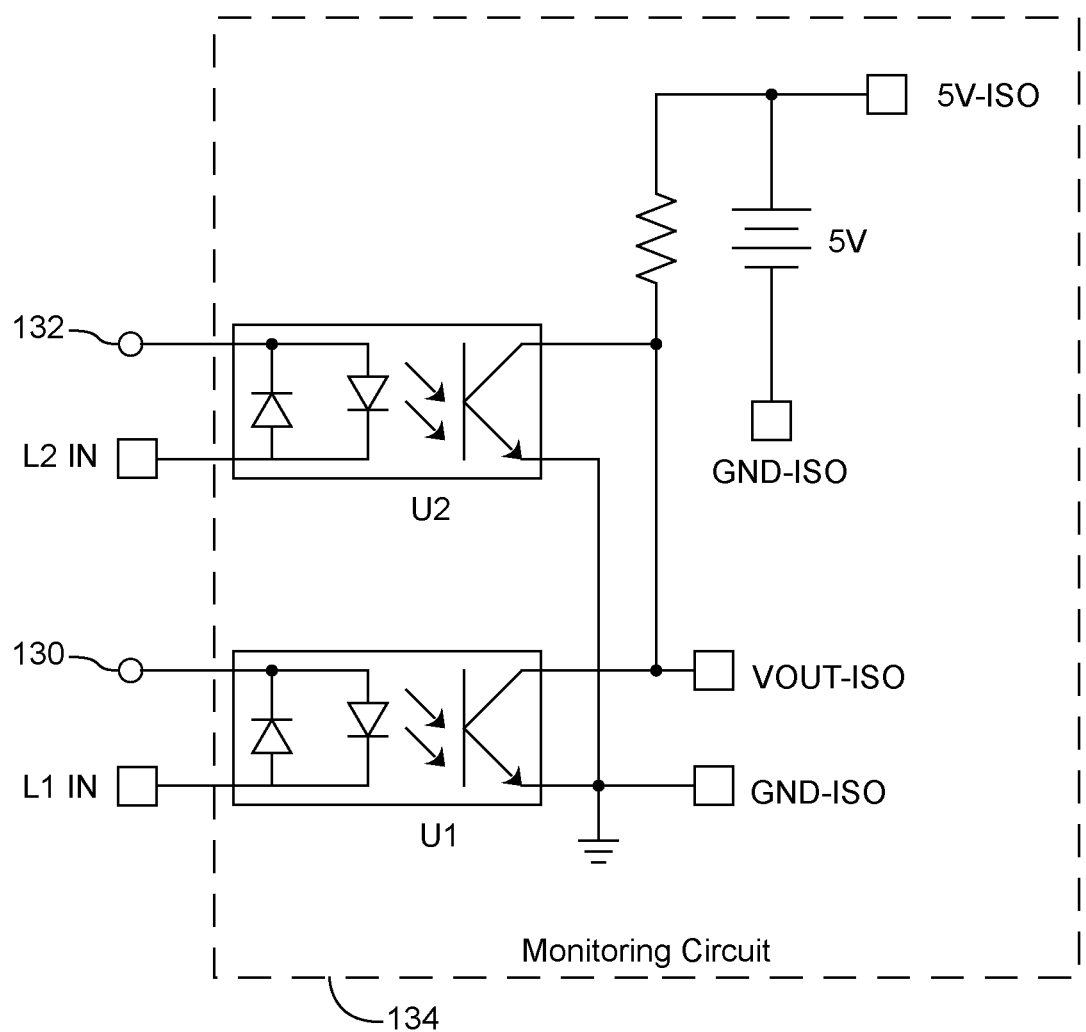
FIG. 10 is a circuit diagram of an example implementation of the monitoring circuit referenced in FIG. 6.

FIG. 10 discloses monitoring circuit 134 in greater detail. Monitoring circuit 134, which as noted above is optional in some embodiments, may include a pair of AC input-type opto-couplers U1 and U2, or alternatively, LEDs, such that in the presence of a compensation current supplied on either output 130, 132, an output VOUT-ISO is energized in an isolated circuit (e.g., a 5 VDC isolated circuit), e.g., to notify a controller of an appliance that leakage current is being compensated for, and optionally, notifying a user that leakage current compensation is or has been activated.

Figure 11:
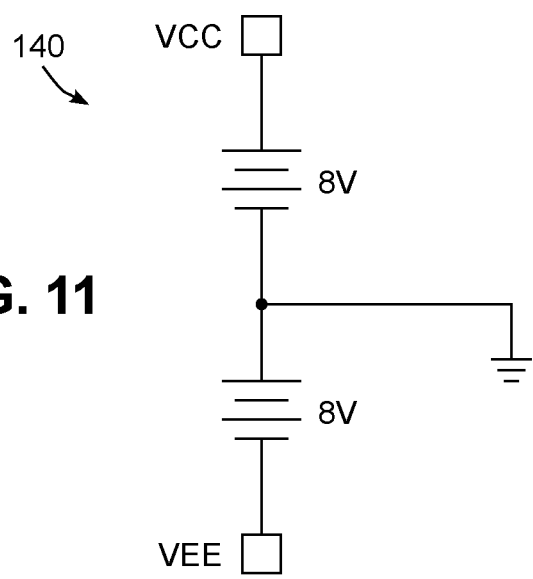
FIG. 11 is a circuit diagram of an example implementation of a bi-polar power supply suitable for use with the leakage current compensation system of FIG. 6.

FIG. 11 illustrates an example power supply 140 that may be used for leakage current compensation system 100 in some embodiments. As may be seen in FIGS. 7-9, each op-amp X1-X4 may be powered by a bi-polar power supply over VCC/VEE inputs in order to generate sufficient current to drive transistors Q1-Q4. In the illustrated embodiment, for example, a +/−8V power supply may be used, e.g., based upon a linear supply design or switchmode-type supply design.

It will be appreciated that various modifications may be made to the embodiments discussed herein, and that a number of the concepts disclosed herein may be used in combination with one another or may be used separately. Therefore, the invention lies in the claims hereinafter appended.

What is claimed is:

1. An apparatus, comprising:
   first and second line inputs respectively configured to receive first and second power signals having respective first and second phases from a multi-phase power circuit;
   first and second line outputs respectively coupled to the first and second line inputs and configured to supply power to a sheathed electrical heating element that generates heat in response to electrical current and that includes a heater core extending through a sheath and electrically insulated from the sheath by an electrically-insulative material;
   a current transformer coupled intermediate the first line input and first line output and intermediate the second line input and the second line output, the current transformer configured to sense a leakage current in one of the first and second power signals;
   a leakage current amplifier circuit coupled to the current transformer to amplify the leakage current sensed by the current transformer; and
   a compensation current generator circuit coupled to the leakage current amplifier circuit and including first and second outputs respectively coupled to the first and second line inputs, the compensation current generator circuit configured to generate a first compensating current in the first output in response to the current transformer sensing the leakage current in the second power signal and to generate a second compensating current in the second output in response to the current transformer sensing the leakage current in the first power signal.

2. The apparatus of claim 1, wherein the multi-phase power circuit is a split-phase power circuit.

3. The apparatus of claim 1, wherein the multi-phase power circuit is a three-phase power circuit, the apparatus further comprising:
   a third line input configured to receive a third power signal having a third phase from the multi-phase power circuit;
   a third line output coupled to the third line input.

4. The apparatus of claim 1, wherein the current transformer includes a first primary winding coupled between the first line input and the first line output, a second primary winding coupled between the second line input and the second line output, and a secondary winding coupled to the leakage current amplifier.

5. The apparatus of claim 4, further comprising a neutral input coupled to the multi-phase power circuit and a neutral output coupled to the neutral input, wherein the current transformer further includes a third primary winding coupled between the neutral input and the neutral output.

6. The apparatus of claim 4, wherein the current transformer includes a ring core, wherein the first line input and first line output are coupled to one another by a first conductor that passes through the ring core, and the second line input and second line output are coupled to one another by a second conductor that passes through the ring core.

7. The apparatus of claim 1, wherein the leakage current amplifier circuit is configured to output an output voltage signal in response to an input voltage signal received thereby, the apparatus further comprising:
   a current to voltage converter circuit coupled intermediate the current transformer and the leakage current amplifier, the current to voltage converter configured to generate the input voltage signal for the leakage current amplifier circuit from the leakage current sensed by the current transformer; and
   a voltage to current converter circuit coupled intermediate the leakage current amplifier and the compensation current generator circuit, the voltage to current converter configured to generate an input current signal to the compensation current generator based upon an output voltage signal from the leakage current amplifier circuit.

8. The apparatus of claim 7, wherein the leakage amplifier circuit includes:
   a voltage amplifier circuit configured to amplify the input voltage signal to generate an intermediate voltage signal having a DC component;
   an AC filter circuit configured to generate a DC offset signal representative of the DC component from the intermediate voltage signal by filtering out an AC component from the intermediate voltage signal; and
   a differential amplifier circuit configured to generate the output voltage signal for the leakage current amplifier circuit by removing the DC component from the intermediate voltage signal in response to the DC offset signal.

9. The apparatus of claim 8, wherein each of the voltage amplifier circuit, the differential amplifier circuit and the voltage to current converter circuit includes an operational amplifier, and wherein the apparatus further comprises a bi-polar power supply configured to power the operational amplifier of each of the voltage amplifier circuit, the differential amplifier circuit and the voltage to current converter circuit.

10. The apparatus of claim 9, wherein the AC filter circuit includes an operational amplifier powered by the bi-polar power supply.

11. The apparatus of claim 1, wherein the compensation current generator circuit includes:
   first and second resistors respectively coupled to the first and second line inputs; and
   first, second, third and fourth transistors, wherein the first and second transistors are active mode n-type transistors and are respectively coupled to the first and second resistors and the third and fourth transistors are active mode p-type transistors and are respectively coupled to the first and second resistors.

12. The apparatus of claim 11, wherein the first, second, third and fourth transistors are MOSFETs, and wherein the apparatus further comprises first, second, third and fourth diodes, the first diode coupled intermediate the first transistor and the first resistor and configured to block reverse current through the first transistor, the second diode coupled intermediate the third transistor and the first resistor and configured to block reverse current through the third transistor, the third diode coupled intermediate the second transistor and the second resistor and configured to block reverse current through the second transistor, and the fourth diode coupled intermediate the fourth transistor and the second resistor and configured to block reverse current through the fourth transistor.

13. The apparatus of claim 11, wherein each of the first and second resistors is implemented using a series arrangement of multiple physical resistors.

14. The apparatus of claim 1, further comprising a monitoring circuit coupled to the first and second outputs and configured to sense the first and second compensating currents and output a monitor signal in response thereto.

15. The apparatus of claim 14, wherein the monitoring circuit includes first and second opto-couplers coupled respectively to the first and second outputs.

16. The apparatus of claim 1, further comprising an appliance including the sheathed electrical heating element, wherein the current transformer, the leakage current amplifier circuit and the compensation current generator are disposed in the appliance.

17. The apparatus of claim 16, wherein the appliance is a cooking appliance and the sheathed electrical heating element is a cooktop or oven cooking element.

18. The apparatus of claim 16, wherein the appliance includes a plurality of sheathed electrical heating elements, and wherein the plurality of sheathed electrical heating elements are powered from the first and second line outputs.

19. The apparatus of claim 18, wherein the appliance includes at least one electrical load powered by only one of the first and second line outputs such that the at least one electrical load is powered by a single phase of the multi-phase power circuit.

20. The apparatus of claim 1, further comprising a power cord, wherein the current transformer, the leakage current amplifier circuit and the compensation current generator are disposed in the power cord.

21. A leakage current compensation system, comprising:
first and second line inputs respectively configured to receive first and second power signals having respective first and second phases from a multi-phase power circuit;
first and second line outputs respectively coupled to the first and second line inputs and configured to supply power to a sheathed electrical heating element that generates heat in response to electrical current and that includes a heater core extending through a sheath and electrically insulated from the sheath by an electrically-insulative material;
a bi-polar power supply;
a current transformer coupled intermediate the first line input and first line output and intermediate the second line input and the second line output, the current transformer configured to sense a leakage current in one of the first and second power signals;
a current to voltage converter circuit coupled to a secondary winding of the current transformer, the current to voltage converter configured to generate a first voltage signal by performing a current to voltage conversion of the leakage current sensed by the current transformer;
a voltage amplifier circuit including a first operational amplifier powered by the bi-polar power supply and configured to amplify the first voltage signal to generate a second voltage signal having a DC component;
an AC filter circuit including a second operational amplifier powered by the bi-polar power supply and configured to generate a DC offset signal representative of the DC component from the second voltage signal by filtering out an AC component from the second voltage signal;
a differential amplifier circuit including a third operational amplifier powered by the bi-polar power supply and configured to generate a third voltage signal by removing the DC component from the second voltage signal in response to the DC offset signal;
a voltage to current converter circuit including a fourth operational amplifier powered by the bi-polar power supply and configured to generate a compensation control signal by performing a voltage to current conversion of the third voltage signal; and
a compensation current generator circuit including first and second outputs respectively coupled to the first and second line inputs, the compensation current generator circuit configured to generate at least one of a first compensating current in the first output and a second compensating current in the second output in response to the compensation control signal.

22. An apparatus, comprising:
first and second line inputs respectively configured to receive first and second power signals having respective first and second phases from a multi-phase power circuit;
first and second line outputs respectively coupled to the first and second line inputs and configured to supply power to an electrical load;
a current transformer coupled intermediate the first line input and first line output and intermediate the second line input and the second line output, the current transformer configured to sense a leakage current in one of the first and second power signals;
a leakage current amplifier circuit coupled to the current transformer to amplify the leakage current sensed by the current transformer; and
a compensation current generator circuit coupled to the leakage current amplifier circuit and including first and second outputs respectively coupled to the first and second line inputs, the compensation current generator circuit configured to generate a first compensating current in the first output in response to the current transformer sensing the leakage current in the second power signal and to generate a second compensating current in the second output in response to the current transformer sensing the leakage current in the first power signal.

* * * * *